United States Patent
Hirano

(10) Patent No.: US 6,195,287 B1
(45) Date of Patent: Feb. 27, 2001

(54) DATA PROGRAMMING METHOD FOR A NONVOLATILE SEMICONDUCTOR STORAGE

(75) Inventor: Yasuaki Hirano, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/497,053

(22) Filed: Feb. 2, 2000

(30) Foreign Application Priority Data

Feb. 3, 1999 (JP) .................................................. 11-026484

(51) Int. Cl.[7] .................................................. A11C 16/04
(52) U.S. Cl. .............................. 365/185.18; 365/185.16; 365/185.03
(58) Field of Search ......................... 365/185.18, 185.16, 365/185.03

(56) References Cited

U.S. PATENT DOCUMENTS

| | | | |
|---|---|---|---|
| 5,528,546 | * 6/1996 | Chao et al. | 365/185.21 |
| 5,557,567 | * 9/1996 | Bergemont et al. | 365/185.16 |
| 5,644,532 | * 7/1997 | Chang | 365/185.16 |
| 5,841,697 | * 11/1998 | Van Houdt et al. | 365/185.14 |
| 5,956,273 | * 9/1999 | Lin et al. | 365/185.19 |
| 5,959,892 | * 9/1999 | Lin et al. | 365/185.28 |

* cited by examiner

Primary Examiner—Richard Elms
Assistant Examiner—Tuan T. Nguyen
(74) Attorney, Agent, or Firm—Morrison & Foerster LLP

(57) ABSTRACT

A data programming method for a nonvolatile semiconductor storage device includes: a number of memory cells each having a control gate, drain and source with an electrically data-programmable, erasable floating gate, arranged matrix-wise in rows and columns forming a memory cell array; a multiple number of word lines, each being connected to the control gates of the memory cells in one row; and a multiple number of bit lines, each being connected to the drains of the memory cells in one column and also connected to the sources of the memory cells in the adjacent column so that each is shared by the two adjacent columns, forming a virtual ground type array, wherein three or more classes of data can be electrically written into each memory cell by differentiating the threshold level of the charge amount accumulated on the floating gate. The method includes: the first writing step for setting the charge amount on the floating gate of each memory cell to be programmed with target data at a first threshold level other than the threshold level of target data; and the second writing step for re-setting the charge amount on the floating gate of the memory cell at the threshold level of target data, after the first writing step.

13 Claims, 12 Drawing Sheets

Program

Erase

Distribution of multilevel threshold levels
(ACT type flash memory)

$|b| = I_{01}$ $|b| = I_{01} + Ir$ $|b| = I_{01} - Ia$

Ia : the amont of the reduction of the current as a result of
the raised potential on BL3 above 0V due to the inflow of Ij $|b| = I_{01}$ $|b| = I_{01} + I_a - I_a = I_{01}$ Ia : the amount of the reduction of the current as a result of the raised potential on BL3 above 0V due to the inflow of Ij

DATA PROGRAMMING METHOD FOR A NONVOLATILE SEMICONDUCTOR STORAGE

BACKGROUND OF THE INVENTION

1. Field of the Invention

The present invention relates to a multilevel programming method for a semiconductor storage, in particular, for floating gate nonvolatile semiconductor storage of a virtual ground memory array.

2. Description of the Prior Art

In recent years, virtual ground type flash memory devices aiming for high packing density have drawn attention, such as for example, 'A New Cell Structure for Sub-quarter Micron High Density Flash Memory' (IEDM Technical Digest, pp.269–270, 1995), and an ACT (Asymmetrical Contactless Transistor) type flash memory disclosed in 'An investigation of a sensing method of an ACT type flash memory' (ICD97-21, p.37, 1997, a technical report of The Institute of Electronics, Information and Communication Engineers).

In such an ACT type flash memory, programming (writing) and erasing operations are implemented based on the FN tunnel effect, and it is expected that it will be used for data storage.

Referring now to FIGS. 1 and 2, this ACT type flash memory will be described.

An ACT type flash memory uses the FN tunnel effect when programming and erasing as stated above, and has a virtual ground array configuration in which each bit line is shared between two memory cells. In such an ACT type flash memory, the bit lines are shared and formed of a diffusion layer to thereby reduce the number of contacts and enable a remarkable reduction of the array area, which leads to high integration.

Next, an ACT type flash memory device, as sectionally shown in FIGS. 2A and 2B, has, in order from the top, a control gate WL, an inter-layer insulating layer, a floating gate FG and a bit line (diffusion layer) arranged in a layered manner. The common bit line formed under and between the adjacent floating gates FG has different donor densities between the drain and source sides.

In FIG. 1 where ACT type flash memory cells are arranged in an arrayed configuration, MBLX represents a main bit line, SBLx represent a sub-bit line formed of a diffusion layer, WLx represents a word line, SGx represents a select gate selection signal line, CONTACT represents a contact point between a main bit line and a sub-bit line (belonging to different layers). Here, x represents an integer ranging from 0 to n.

Next, programming and erasing operations for an ACT type flash memory using the FN tunnel effect will be described.

First, programming the ACT type flash memory (see FIG. 2A) is performed with a negative voltage of −8 (v) applied to the control gate i.e., word line WL and a positive voltage of 5 (v) applied to the drain side. By this voltage application, the FN tunnel effect occurs on the drain side so that electrons are extracted from floating gate FG to the drain side. This extraction lowers the threshold voltage, thus implementing programming. Here, word line WL is also referred to as control gate WL.

An erase operation is performed with a high voltage of 10 (v) applied to control gate WL and a negative voltage of −8 (v) applied to a bit line BL and the substrate 109 (P-portion) so as to generate the FN tunnel effect between the channel layer (channel) and floating gate FG to thereby inject electrons into the floating gate FG. This injection of electrons raises the threshold voltage, which means that erasing is implemented.

A more detailed operation will be described based on the basic configuration of one memory cell M schematically shown in FIG. 3.

To begin with, for a program operation, or to extract electrons from floating gate FG, a negative voltage Vnw (−8 (v)) is applied to control gate WL, a positive voltage Vpp (+5 (v)) is applied to drain 105 and source 107 is set floating. Under these conditions, electrons are drawn from floating gate FG by the FN tunnel effect, and thereby the threshold voltage of memory cell M is lowered to about 1.5 (v).

For an erase operation, or to inject electrons into floating gate FG, a positive voltage Vpe (+10 (v)) is applied to control gate WL, a negative voltage Vns (−8 (v)) is applied to source 107 and drain 105 is set floating. Under these conditions electrons are injected into floating gate FG by the FN tunnel effect and thereby the threshold voltage of memory cell M is raised over about 4 (v).

A flash memory as above which uses the FN tunnel effect for both program and erase operations is called an FN-FN operating flash memory.

For a read operation, 3 (v) is applied to control gate WL, 1 (v) is applied to drain 105, 0 (v) is applied to source 107. The current flowing through cell M under the conditions, is detected by an unillustrated sensing circuit to read out the data.

The application of voltage for the above operations is summarized in Table 1.

TABLE 1

Application of voltage to a conventional flash memory

|  | Control Gate | Drain | Source | P-type Well |
| --- | --- | --- | --- | --- |
| Program | −8 V | 5 V | Open | 0 V |
| Erase | 10 V | Open | −8 V | −8 V |
| Read | 3 V | 1 V | 0 V | 0 V |

Here, the values shown in Table 1 are voltages to be applied to a selected memory cell M.

In the field of memory technology, as an attempt to aim at higher integration, multilevel techniques for introducing three or more threshold levels to each memory cell M have been published.

The examples include the methods disclosed in 1996 ISSCC Dig. Tech. Papers, pp36–37 "A 98 mm$^2$ 3.3V 64 Mb-Flash Memory with FN-NOR Type-4level cell" and in Japanese Patent Application Laid-Open Hei 6 No.177397.

In these methods, an FN-NOR type flash memory is used. Programming pulses for data '11', '10' and '01' are simultaneously applied by applying different voltages to drains 105 with respect to each data, making use of the cell characteristics shown in FIG. 4. Based on these characteristics, memory cell M is programmed so as to have a voltage falling within one of the threshold voltages in the distribution shown in FIG. 5.

As shown in FIG. 5, data '00' is the erased state.

Subsequently, a verify operation (data verification after programming) is performed in two stages.

At the first stage, the reference voltage Ref (the standard voltage with which comparison is made) is set at around 2.3

(v), for example, so as to judge whether the threshold voltage falls within the '11' and '10' states or within the '01' and '00' states shown in FIG. 5.

Next, at the second stage, a different operation as follows will be effected based on the sensed result from the first stage.

When the sensed result from the first stage falls within the '11' or '10' state, then the reference voltage Ref is set at 1.3 (v), for example, so as to determine whether the level is '11' or '10'.

When the sensed result from the first stage falls within the '01' or '00' state, then the reference voltage Ref is set at around 3.3 (v), for example, so as to determine whether the level is '01' or '00'.

The above operations, that is, application of the programming pulses are repeated based on the verification result until the desired threshold voltage is obtained. Generally, the characteristics fluctuate when the FN tunnel effect is used, so that a pulse width shorter than that meeting the actual characteristic is used. That is, pulse applications (voltage application to drain 105) are stopped in the order in which programming is completed, so as to set the designated threshold voltages whilst preventing the lowering of the threshold voltages.

Next, description will be made of a case where the four-level programming method used in the aforementioned FN-NOR type flash memory is applied to a virtual ground ACT type flash memory.

FIG. 6 shows a flowchart of the programming algorithm of this case.

With the selected word line (WL) set at −8 (v), pulses of voltage corresponding to the data for individual cells M which are to be programmed with data '11', '10' or '01' are applied simultaneously to respective drains 105 of the cells M as the drain voltage (Vd) so as to effect data writing (Step S11).

As the drain voltage Vd, 6 (v) is applied to the drains of cells M which are to be programmed with data '11'; 5 (v) is applied to the drains of cells M corresponding to data '10'; and 4 (v) is applied to the drains of cells M corresponding to data '01'. Here, data '00' corresponds to the erased state.

Subsequently, a verify operation (data verification after data writing) is performed (Step S12). For the verify operation, the word line (WL) is set at 1 (v), 2 (v) and 3 (v) as the reference voltage Ref, and it is judged whether the threshold voltage in each cell M is equal to or lower than the threshold level corresponding to the desired data.

Then, the cells M not having the desired levels are re-programmed (S11) and verified again (S12) so that they will have the desired levels (S13).

As a result, the distributions of the threshold levels under the condition in which there is no influence from the virtual ground array configuration are as follows: cells M programmed with data '11' have a threshold voltage ranging from 0.6 (v) to 1 (v); cells M programmed with data '10' have a threshold voltage ranging from 1.6 (v) to 2 (v); cells M programmed with data '01' have a threshold voltage ranging from 2.6 (v) to 3 (v). Data '00' corresponds to the erased state and hence has a voltage equal to 3.6 (v) or above.

However, the characteristics of programming using the FN tunnel effect fluctuate. Therefore, all the programmings of data '11', '10' and '01' will not complete at the same time when using the aforementioned technique of switching the drain voltage Vd of FN-NOR type.

Further, when the aforementioned programming algorithm (FIG. 6) is applied to a virtual ground type array shown in FIG. 8, in addition to the fluctuation of the programming characteristics, apparent levels of the threshold voltages read out from memory cells M may shift higher or lower and hence the distribution may spread depending upon the pattern of data (the pattern of the threshold levels in the memory cells M) which has been programmed in the memory cells M. The spread of each threshold voltage reduces the detecting margin relative to the corresponding reference voltage Ref. leading to mal-detection.

Now, this widening behavior of the threshold voltage will be illustrated with reference to FIGS. 9, 10 and 11.

To begin with, a pattern of data which will not be affected by the virtual ground configuration is shown in FIG. 9.

As shown in FIG. 9, memory cells M0O, M01, M03, M04 and M05 are programmed with data '00' while memory cell M02 is programmed with data '01'. The algorithm of programming in this case is as shown in FIG. 6.

Application of programming pulses is performed such that first, word line (WL0) set at −8 (v) and bit lines BL0, BL1, BL3, BL4 and BL5 are set open while 4 (v) is applied to bit line BL2 (c.f. FIG. 4, for programming of data '01'). This allows programming of memory cell M02 (S11) so that the threshold voltage of memory cell M02 lowers.

Next, a verify operation is performed (S12). Here, description will be made only about the verification of memory cell M02.

Since data '01' corresponds to a threshold voltage equal to 3 (v) or below, word line (WL0) is set at 3 (v), and voltages shown in FIG. 9 are applied to corresponding bit lines BL.

That is, BL0=0 (v), BL1=1 (v), BL2=1 (v), BL3=0 (v), BL4=0 (v), BL5=1 (v) and BL6=1 (v).

Here, bit line BL1 is set at 1 (v) in order to prevent a roundabout current flowing through memory cell M01. Here, it should be understood that the bit lines are provided as units of four bits (BL0 to BL3, BL4 to BL7 and the like), without a description in detail.

For verification, 1 (v) is applied to bit line BL2. In this case, if the current at the node on bit line BL2, flowing through memory cell M02 from bit line BL2 to bit line BL3 (IO1 in FIG. 9) is greater than the sensitivity of an unillustrated sensing circuit (e.g., 1 ($\mu$A) or greater), the writing is ended. If the current is lower than the sensitivity, application of the programming pulses to memory cell M02 is repeated (see FIG. 6).

In the example shown in FIG. 9, since the cells other than memory cell M02 are all in the erased state (having data '00' and hence having a high threshold, equal to or higher than 3.6 (v)), no current will flow out from bit line BL2 and no current will flow into bit line BL3 via neighboring cells. Therefore, for readout at the time of verification, no apparent change in threshold voltage due to the influence of the virtual ground type array configuration will appear.

Next, description will be made of cases where the virtual ground type array configuration has an influence on the result.

First, referring to FIG. 10, a case where the threshold voltage of memory cell M is seemingly lowered.

This is the case when memory cells M0O and M01 are programmed with data '11', memory cell M02 is programmed with '01' and memory cells M03, M04 and M05 are programmed with '00'.

In this case, with word line (WL0) set at −8 (v), 6 (v) is applied to bit lines BL0 and BL1 (to write data '11' thereinto, c.f. FIG. 4) and 4 (v) is applied to bit line BL2 (to write data '01' thereinto) while bit lines BL3, BL4, BL5 and BL6 are set in the open state.

Because of fluctuations of the characteristics of individual memory cells M, the first pulse application for programming may produce a state where the memory cell corresponding to data '01' can be set at a desired level or below 3 (v) while memory cells M00 and M01 have been little varied, remaining at a voltage greater than 3.6 (v) (the aimed threshold voltage is 1 (v)).

If readout is performed in this state, the data pattern will be the same as that previously shown in FIG. 9.

That is, at this stage, when readout is performed with word line (WL0) set at 3.4 (v), the current measured at the node on bit line BL2, or the current IO1 flowing through memory cell MO2 from bit line BL2 to bit line BL3 is assumed as the normal current IO1 or is not be affected by the threshold levels of other memory cells (readout is performed with each readout voltage set higher by about 0.4 (v) than the corresponding threshold voltage while the verify voltage is set equal to the desired threshold voltage to be programmed unless otherwise specified.).

Thus, memory cell MO2 has been programmed with the desired value (corresponding to data '01'), the next programming pulse application is done with bit line BL2 open so that the threshold voltage of memory cell MO2 will not vary.

On the other hand, memory cells M00 and M01 have not reached the desired level (1 (v)), so that 6 (v) is applied to bit lines BL0 and BL1 for the next programming pulse application. Thus, application of some or several pulses is performed until memory cells M00 and M01 are set at a threshold voltage equal to or lower than the desired level, i.e., 1 (v), to complete the programming.

When readout is performed after the completion of programming, about 3.4 (v) which corresponds to the readout voltage D3 shown in FIG. 7 is applied to the word line (WL0) in order to distinguish data '00' from data '01', for example.

When data is read out from memory cell MO2, a roundabout current Ir flows via memory cells M00 and M01 having lower thresholds, In addition to the normal current IO1, making up the current |b| at the node on bit line BL2, as shown in FIG. 10.

As a result, the current |b| measured at the node on bit line BL2 is increased and detected as current (IO1+Ir). Therefore, the threshold voltage of memory cells MO2 is seemingly shifted in the lower direction.

Up to here was the description of the case where the threshold voltage is shifted in the lower direction.

Next, referring to FIG. 11, a case where the threshold voltage is shifted in the higher direction will be discussed. This case corresponds to a case, for example, where memory cells M00, M01 and M05 are programmed with '00', memory cell MO2 are programmed with '01' and memory cells MO3 and MO4 are programmed with '11'. In this case, programming pulse application is performed with word line WL0 set at −8 (v), 4 (v) is applied as drain voltage Vd to bit line BL2, and 6 (v) is applied as drain voltage Vd to bit lines BL3 and BL4 while bit lines BL0, BL1 and BL5 are set in the open state. The characteristics of individual memory cells M vary as stated above: for example, the first pulse application may produce a state where the threshold voltage of memory cells MO2 is set at a level equal to or below 3 (v) while the threshold voltages of memory cells MO3 and MO4 have been little varied, remaining at a voltage greater than 4 (v).

If readout is performed in this state, the pattern of data is the same as that previously shown in FIG. 9. Accordingly, the current measured at the node on bit line BL2, i.e., the current flowing through memory cell MO2 from bit line BL2 to BL3 is assumed as the normal current IO1.

Thereby, programming of memory cell MO2 has been completed. So the next programming pulse application is done with bit line BL2 open while a drain voltage of 6 (v) is applied to bit lines BL3 and BL4. Thus, programming pulse application and verification are repeated for some or several times. By this procedure, the threshold voltages of memory cells MO3 and MO4 are reduced to the desired level, i.e., 1 (v) or below.

After the completion of the entire programming, when data is read out from memory cell MO2 with word line WL0 set at 3.4 (v), a roundabout current Ij flows via memory cells MO3 and MO4 having lower thresholds (1(v)), from bit line BL5 to BL3 as shown in FIG. 11, resultantly raising the potential of bit line BL3.

Thereby, a current (IO1−Ia) (here Ia is the reduction in current due to the influence of roundabout current Ij from memory cells MO3 and MO4 as shown in FIG. 11) flows at the node on bit line BL2 from bit line BL2 to BL3 via memory cell MO2. Therefore, the current detected at the node on bit line BL2 is reduced by (−Ia) compared to the prior state before the data in memory cells MO3 and MO4 are established. Accordingly, the threshold voltage of memory cell MO2 is seemingly detected to be higher and hence is observed that the threshold level is shifted higher.

The hatched area in FIG. 12 represents the widened distribution of the threshold voltage of the memory cell M which has been programmed with data '01'.

A further description in detail will be made about roundabout currents Ir and Ij which cause the threshold voltage distribution to spread.

First, description will be made of roundabout current Ir.

As shown in FIG. 10, in the case where memory cells M00 and M01 have a low threshold voltage such as for representing data '11', a roundabout current Ir will flow by way of memory cells M00 and M01 in addition to the current IO1 normally flowing through memory cell MO2 when data is read out from memory cell MO2.

Because bit line BL1 is also set at 1 V in order to prevent the occurrence of roundabout current, normally no roundabout current should occur. However, a virtual ground ACT type flash memory uses bit lines BL formed of a diffusion layer as shown in FIGS. 1 and 2, so that it presents high resistance, which may cause a voltage drop of about 0.5 (v), for example. This is why a roundabout current Ir as above will arise.

In this way, if an increased current (IO1+Ir), which is greater than the normal current IO1, is detected at the node on bit line BL2. the threshold voltage of cell MO2 is erroneously detected as a seemingly lower value by an unillustrated sensing circuit. This state means that the distribution of the threshold level is seemingly shifted towards the lower side (in the direction of arrow L in FIG. 12) widening its range, as shown in FIG. 12.

Further, also when cells M00 and M01 have data '00' (which has a greater threshold voltage than that of cell 02) and cells MO3 and MO4 have data '11' (which has a lower threshold voltage than that of cell 02) as shown in FIG. 11, erroneous detection can occur. In this case, no roundabout current Ir flows on the cell MO1 side. However, because bit line BL5 is set at 1 (v) (the same pattern of voltage applied to BL1 in the block of bit lines BL0 to BL3 is applied correspondingly to BL5 in the block of bit lines BL4 to BL7), a roundabout current Ij flows through memory cells MO3 and MO4 having lower threshold voltages. Theoretically if bit line BL4 is set at 0 (v), a current only flows through bit line BL4 by way of memory cell MO4 without producing any influence on bit line BL3. However, since bit lines are formed of a diffusion layer having a high resistivity as stated above, the potential of bit line BL4 arises and hence a current also flows via memory cell MO3. Since bit line BL3 is also formed of a diffusion layer, the potential also rises over the inherent potential or 0 (v).

In the above case, the current (|b|=IO1−Ia:Ia is the current reduction in response to the increase of the potential of bit line BL3 due to roundabout current IJ) for cell MO2 at the node of bit line BL2 decreases due to the backgating effect. This causes the apparent threshold voltage to be detected higher than that in the normal state of memory cell MO2 (in the state where only current IO1 flows therethrough).

This state means that the detected distribution of the apparent threshold level is widened in the direction of arrow H as indicated by the hatched area in FIG. 12.

As above, the virtual ground array configuration will affect and widen the distribution of the threshold voltage as shown in FIG. 12 and disturb correct readout when data is read out after the completion of programming.

As shown in FIG. 12, if there is no influence of roundabout current from the virtual ground array configuration, the distribution of the threshold level corresponding to data '01' should normally fall within the range of 2.6 to 3.0 (v), but the distribution will spread falling within the range of 2.3 to 3.2 (v) due to that influence. Therefore, if the readout voltage D2 (see FIG. 7) for distinguishing between data '01' and '10' is set at 2.4 (v), data will be read out erroneously.

SUMMARY OF THE INVENTION

The present invention has been devised in order to solve the above problems and it is therefore an object of the present invention to provide a programming method of a virtual ground type memory array whist inhibiting widening of the threshold levels each individual memory cell.

In order to achieve the above object, the present invention is configured as follows:

In accordance with the first aspect of the present invention, a data programming method for a nonvolatile semiconductor storage device includes: a number of field effect transistors each having a control gate, a drain and a source with an electrically data-programmable and erasable floating gate, arranged matrix-wise in rows and columns forming an array; a plurality of row lines, each being connected to the control gates of the field effect transistors in one row; and a plurality of column lines, each being connected to the drains of the field effect transistors in one column and also connected to the sources of the field effect transistors in the adjacent column so that each is shared by the two adjacent columns, forming a virtual ground type array, wherein three or more classes of data can be electrically written into each field effect transistor by differentiating the threshold level of the charge amount accumulated on the floating gate, and the method includes: the first writing step for setting the charge amount on the floating gate of each field effect transistor to be programmed with target data at a first threshold level other than the threshold level of target data; and the second writing step for setting the charge amount on the floating gate of the field effect transistor at the threshold level of target data, after the first writing step.

In accordance with the second aspect of the present invention, the data programming method for a nonvolatile semiconductor storage device having the above first feature is characterized in that the three or more classes of data are, based on the threshold levels of the data, composed of a first group of data which is written in by skipping the first step and effecting the second writing step and a second group of data which is written by effecting both the first and second writing steps.

In accordance with the third aspect of the present invention, the data programming method for a nonvolatile semiconductor storage device having the above first or second feature is characterized in that the first threshold level is set at a level higher than the threshold level of the target data.

In accordance with the fourth aspect of the present invention, the data programming method for a nonvolatile semiconductor storage device having the above first or second feature is characterized in that the data which is written in by both the first and second writing steps includes the data having the second to highest threshold level among the three or more classes of data.

In accordance with the fifth aspect of the present invention, the data programming method for a nonvolatile semiconductor storage device having the above second feature is characterized in that the data which is written in by skipping the first step includes the data having the lowest threshold level among the three or more classes of data.

In accordance with the sixth aspect of the present invention, the data programming method for a nonvolatile semiconductor storage device having the above first or second feature, further includes a step of verifying the threshold level, prior to the second writing step.

In accordance with the seventh aspect of the present invention, the data programming method for a nonvolatile semiconductor storage device having the above first or second feature is characterized in that the verifying voltage to be used for verifying the threshold level in the first writing step is equal to the readout voltage to be used for reading out the data having been written in the field effect transistors.

According to the present invention, the charge amount on the floating gate of a field effect transistor to be written in with target data is temporarily set into the first threshold level, which is other than the aimed threshold level, by the first writing step, and then is set into the threshold level of target data, by the second writing step.

If the associated transistor is directly set into the threshold level corresponding to target data by the first writing step, the threshold level of target data may be misjudged if some roundabout currents exist when the data is read out. In accordance with the present invention, the transistor is first set at the first threshold level which is other than the aimed threshold level, so that it is possible to produce a controlled state of roundabout current generation, in the state which is shifted by the predetermined level from the aimed threshold level when the second writing step is operated after the completion of the first writing step.

By effecting the second writing step in this generated state of roundabout current, it is possible to set up the threshold level by previously taking into account the roundabout current in the second writing step. As a result, if a roundabout current arises when data is read out, it is possible to prevent widening of the threshold level of the field effect transistor, thus making it possible to prevent misreading of the data due to expansion of the threshold level.

Since the first threshold level is set at a level higher than the threshold level of the target data, it is possible to effectively prevent the widening of the threshold level.

Further, since the data that is hardly affected by a roundabout current can be processed directly by skipping the first writing step and effecting the second writing step, the efficiency of the programming can be improved.

For example, one which has the lowest threshold level of the charge amount accumulated on the floating gate will not become conductive with respect to the threshold levels higher than that, so no roundabout current will arise. Therefore, it is possible to improve the processing efficiency by omitting the first writing step.

Since the second writing step is effective towards the data having a high threshold level and omission of writing the data having the highest threshold level is efficient, the data which is written in by both the first and second writing steps includes the data having the second to highest threshold level of the charge amount accumulated on the floating gate.

The step of verifying the threshold level prior to the second writing step can eliminate the unnecessary second writing step, hence making it possible to improve the processing speed.

Setting the verifying voltage to be used for verifying the threshold level in the first writing step equal to the readout voltage to be used for reading out the data having been written in the field effect transistors makes it possible to reduce the set number of supply voltages, hence reducing the voltage source circuit etc., in size and cost and being effective in simplifying the device.

DESCRIPTION OF THE PREFERRED EMBODIMENTS

Figure 12:
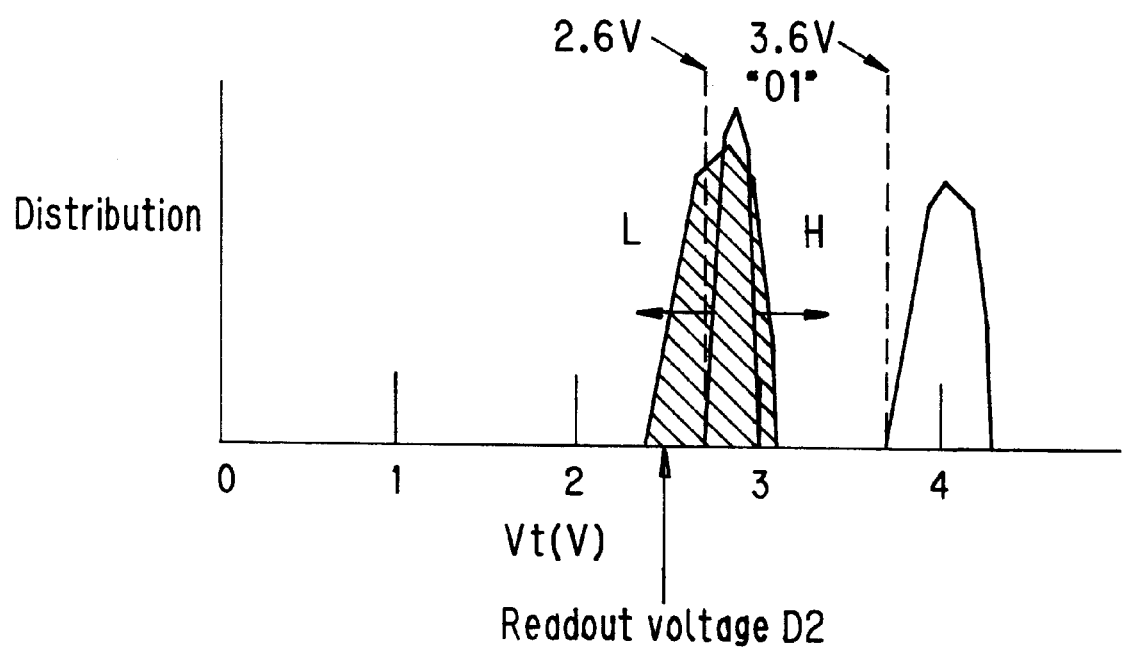
FIG. 12 is an illustrative chart showing the change of a threshold level of a memory cell due to the influence of a virtual ground type configuration in accordance with a conventional programming method.

The embodiments of the present invention will hereinafter be described in detail with reference to the accompanying drawings. Herein, the description of the same components as written above is omitted by allotting the same reference numerals. Though, in FIG. 12 detailed above, the threshold voltage of memory cell M programmed with data '01' was shown, widening of the apparent threshold level arises in a similar manner as in the case of data '10' and '11'. Nevertheless, widening for these data is not so large as that of data '01'. The reason is as follows. That is, roundabout currents Ir and Ij arise because the generated current is the greatest due to the large difference between the threshold voltages of data '01' and '11'. On the other hand, the threshold voltage of data '11' is the lowest. Therefore, when data '11' is verified and read out, the lowest voltage is applied to the word line WL of the associated memory cells. Hence memory cells M programmed with other data '01' or '10' will not become conductive so no roundabout current will arise (A cell with data '00' has the greatest threshold voltage but remains in the erased state and will not be programmed, so there is no need to consider this here.)

In conclusion, the memory cells programmed with data '01' will be most markedly affected by the virtual ground array configuration.

In the embodiment of the present invention, widening of the threshold voltage in the memory cell programmed with data '01', caused by the roundabout current arising between the memory cell programmed with data '01' and the memory cell programmed with data '11', is a typical example as the worst case and hence this example will be described with reference to the patterns of data shown in FIGS. 10 and 11.

For easy understanding of the description of the operations etc., the description will be made by referring to the same memory cell, i. e., MO2, together with memory cells MO0, MO1, MO3, MO4 and MO5 adjacently connected to the same word line (WL0).

Apparent widening of the distribution of the threshold voltage of memory cell M is caused by the difference in time in its being set to the designated threshold voltage, which depends upon the programming characteristics of an individual memory cell M. Because of this difference, a roundabout current which was not taken into account when the threshold voltage was set up by previous programming with verification, may arise when data is read out.

The embodiment of the present invention is to reduce widening of the distribution of the threshold voltage occurring due to the roundabout current, by setting the threshold voltage by taking into account the roundabout current arising at the time of readout when programming the memory cell whilst verifying. Now, the embodiment will be described more specifically.

The First Embodiment

Figure 13:
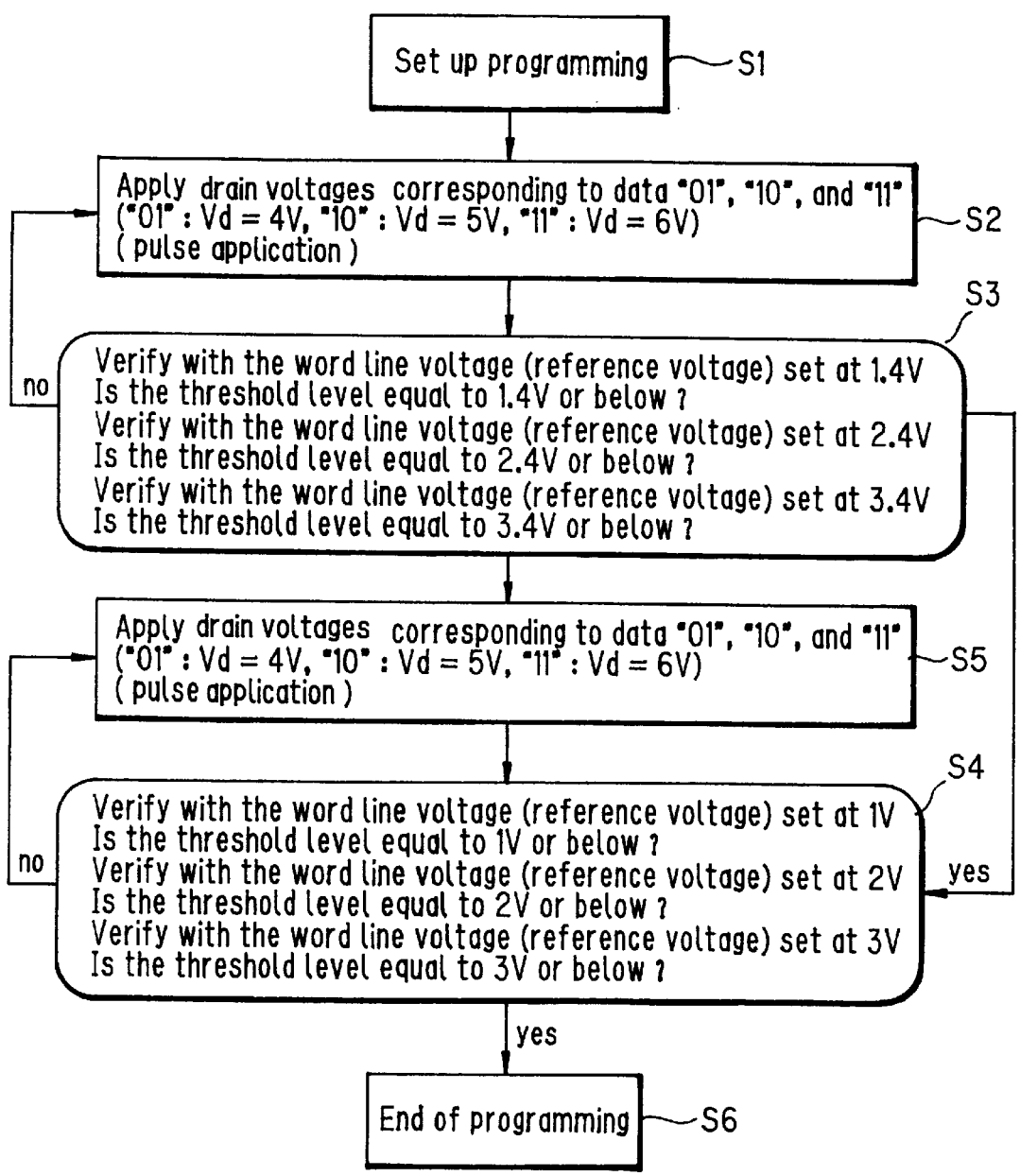
FIG. 13 is a flowchart for illustrating a method of writing multilevel data to the memory cells of the memory in accordance with the first embodiment of the present invention.
Figure 14:
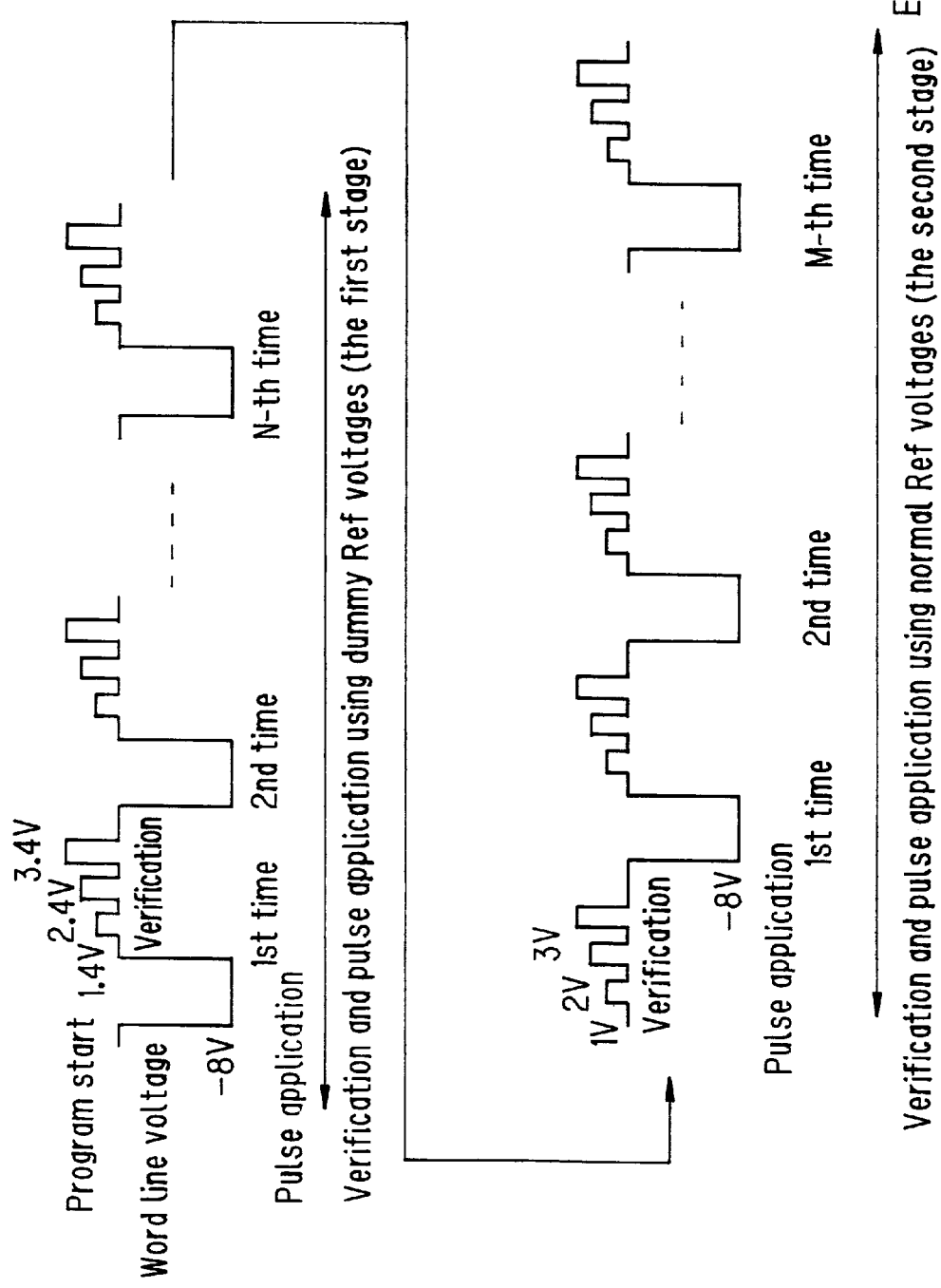
FIG. 14 is an operative diagram for illustrating the pulse application and verification sequence of the method of writing multilevel data to the memory cells of the memory in accordance with the first embodiment of the present invention.

The algorithm of the programming method for a nonvolatile semiconductor storage device in accordance with the first embodiment of the present invention will be described with reference to FIG. 13. Also the sequence of programming voltage application and its verification is shown in FIG. 14.

Figure 1:
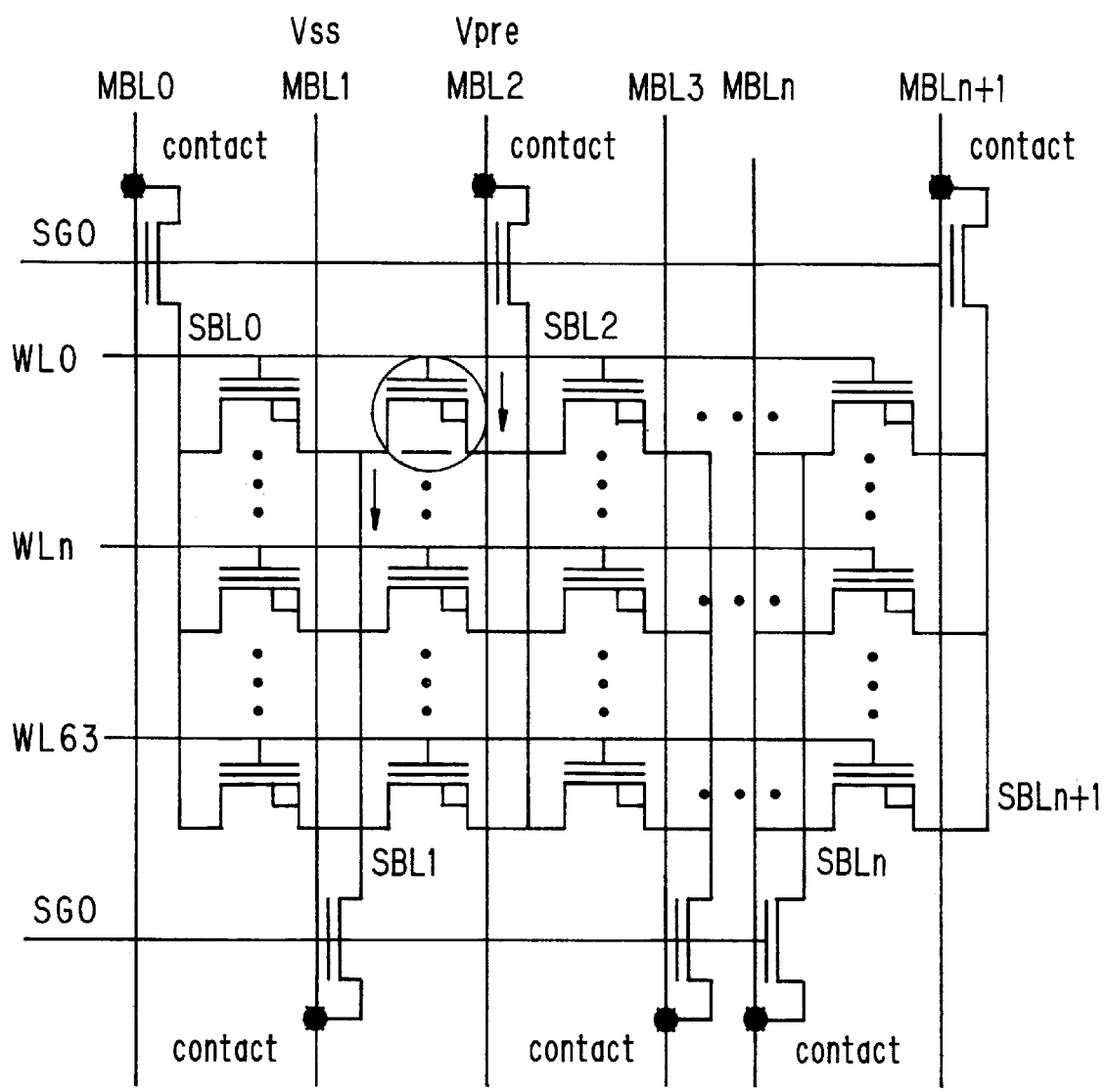
FIG. 1 is a circuit diagram showing an ACT type flash memory.
Figure 2A:
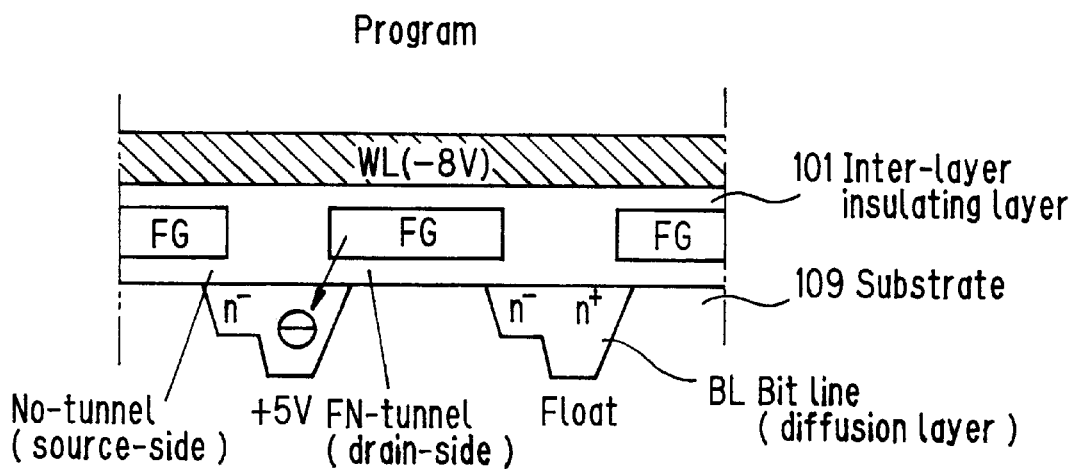
FIGS. 2A and 2B are operative illustrations showing programming (FIG. 2A) and erasing (FIG. 2B) of an ACT type flash memory.
Figure 2B:
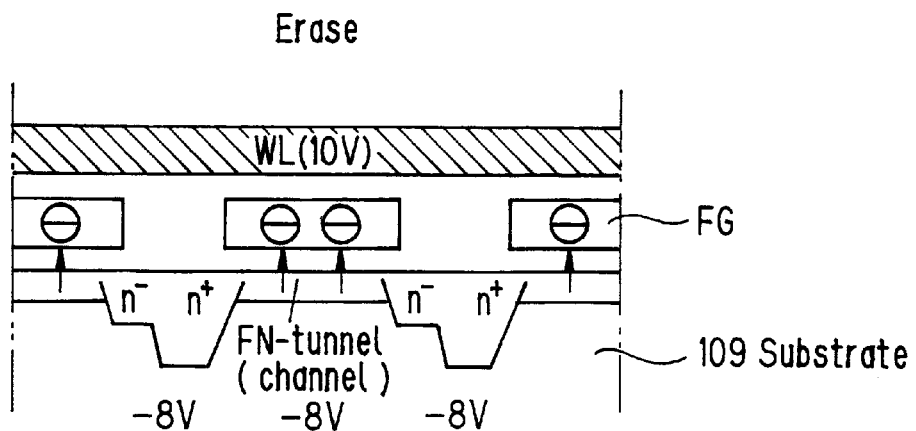
Figure 3:
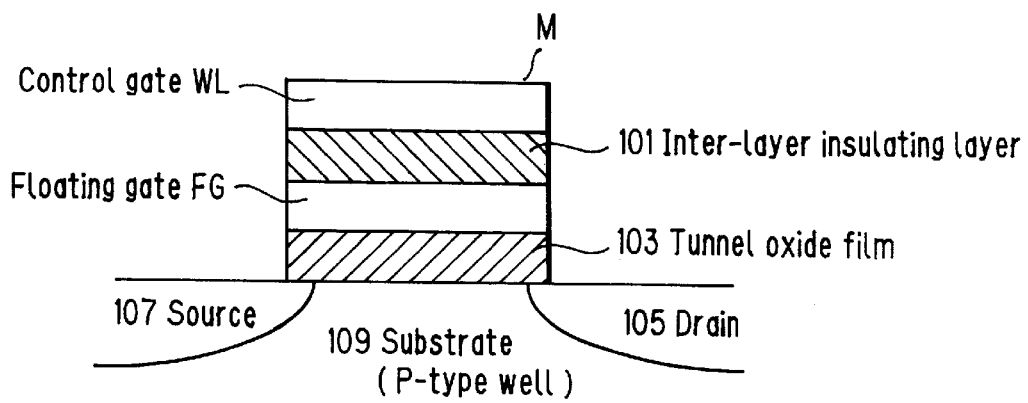
FIG. 3 is an illustrative view showing the configuration of an ACT type flash memory M.
Figure 4:
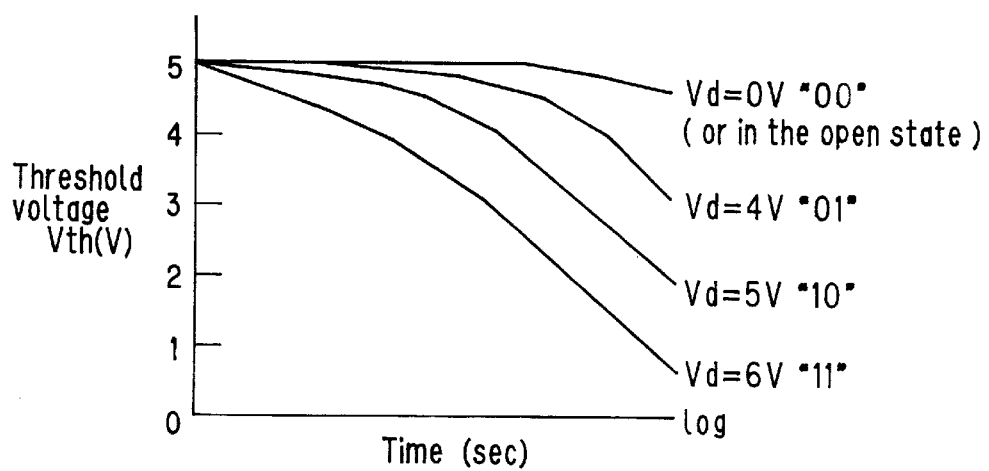
FIG. 4 is a chart showing threshold voltages to be programmed into in an FN-NOR type flash memory cell and corresponding to three or more levels of data in relation to the drain voltages.
Figure 5:
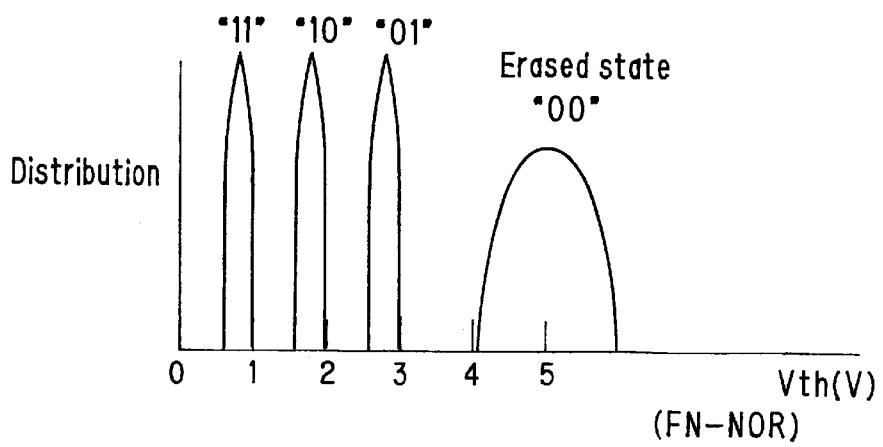
FIG. 5 is a chart showing a distribution of threshold voltages corresponding to individual data to be programmed into an FN-NOR type flash memory cell.
Figure 6:
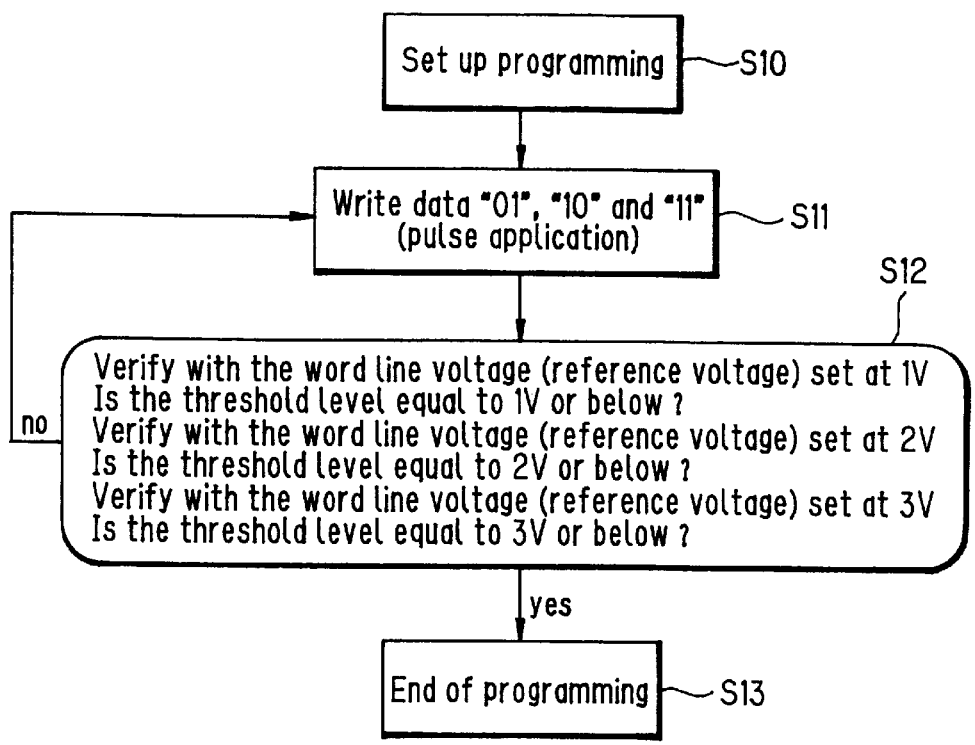
FIG. 6 is a flowchart of a conventional multilevel data programming method for an FN-NOR type flash memory.
Figure 7:
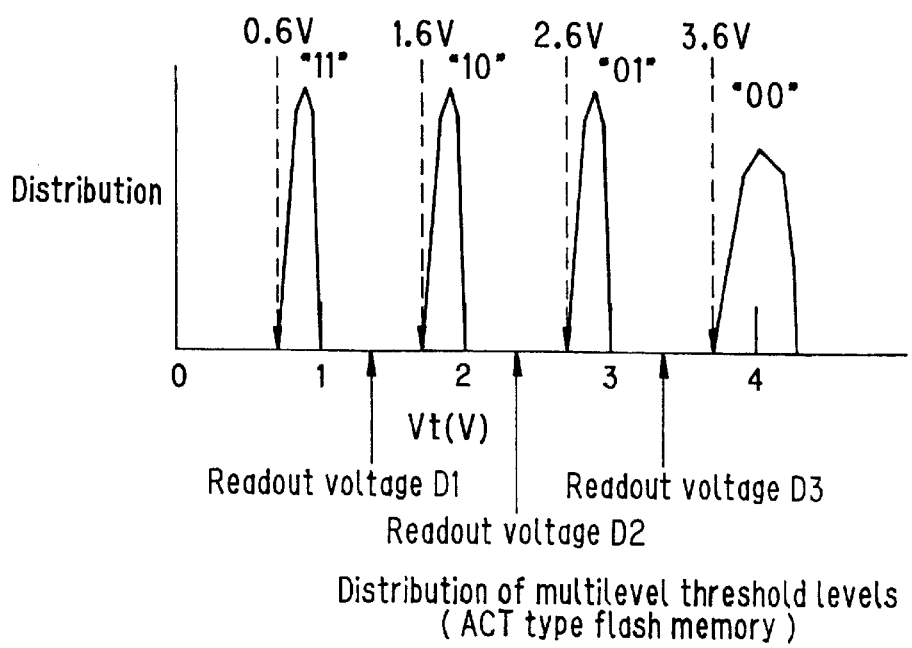
FIG. 7 is a chart showing the distribution of multilevel data in a memory cell M.
Figure 8:
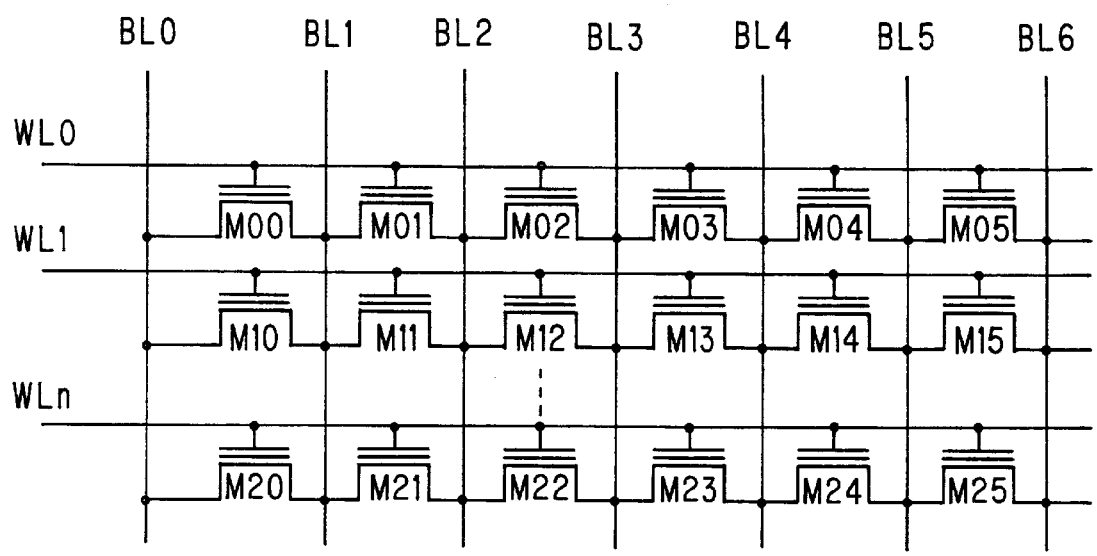
FIG. 8 is a diagram showing an array configuration of an ACT type flash memory M of a virtual ground type.

Programming of four levels is adopted as an example of this embodiment. The distribution of threshold voltage of memory cell M when not affected by the virtual ground array configuration, is shown in FIG. 7. Here, data '00' corresponds to the erased state.

As the programming operation is started from step 1 (step is abbreviated 'S' hereinbelow), the associated word line is set at −8(v) and then drain voltages Vd are applied to individual memory cells in accordance with the corresponding data (S2).

For example, a drain voltage Vd of 6 (v) is applied for data '11'; a drain voltage Vd of 5 (v) is applied for data '10'; a drain voltage Vd of 4 (v) is applied for data '01'; and the drain is set open for data '00'.

Triggered by the voltage application, the threshold level of each memory cell M starts lowering to the associated threshold voltage due to the FN tunnel effect.

Once the application of the programming voltages is terminated, then each cell is verified (S3). That is, each memory cell M is verified by applying a voltage (the first threshold voltage) which is higher than the threshold level to be finally set for the cell as shown in FIG. 14, to the associated word line WL. Based on the result, further writing is effected so that all the cells are set at the associated first threshold voltages (S2 and S3).

For example, if the final threshold voltage needs to be set at 3 (v) which corresponds to data '01', 3.4 (v) is applied to the associated word line WL. This voltage is preferably greater than the maximum of the threshold distribution that is shifted higher by the influence of the aforementioned virtual ground array configuration.

As shown in FIG. 14, the cells are verified by applying 1.4 (v) to the word line WL and then 2.4 (v) and 3.4 (v). Based on the verification results, any memory cell M having a level greater than the designated threshold voltage is further written and then verified so that the memory cell M for data '11' is set at a threshold voltage of 1.4 (v) or lower, the cell M for data '10' is set at a threshold voltage of 2.4 (v) or lower and the cell M for data '01' is set at a threshold voltage of 3.4 (v) or lower.

If all the memory cells M to be programmed have been set at the associated first threshold voltages, then each cell is verified by applying an altered voltage to the word line WL, or by applying a voltage (the second threshold voltage) which is the threshold level to be finally set for the cell (S4).

For example, a memory cell M to be programmed with data '01' is verified with word line WL set at 3 (v). This is to determine whether the threshold voltage of memory cell M is not higher than 3 (v) or falls within the range of 3 to 3.4 (v).

In this way, it is determined if the threshold voltage of a memory cell M corresponding to data '11' is 1 (v) or below, if the threshold voltage of a memory cell M corresponding to data '10' is 2 (v) or below and if the threshold voltage of a memory cell M corresponding to data '01' is 3 (v) or below.

Then, upon the next application of programming pulses at S5, if the threshold voltage of a memory cell M corresponding to data '01' has been set at 3 (v) or below, the drain of the memory cell M is set open so as not to further lower the threshold voltage of the memory cell M. In the same manner, if the threshold voltage of a memory cell M corresponding to data '10' has been set at 2 (v) or below and if the threshold voltage of the memory cell M corresponding to data '11' has been set at 1 (v) or below, the drains of the memory cells M are set open.

On the other hand, for a memory cell M having a level greater than the designated threshold voltage, a drain voltage Vd of 4 (v) is applied to a memory cell M to be programmed with data '01'; a drain voltage Vd of 5 (v) is applied to a memory cell M to be programmed with data '10'; and a drain voltage Vd of 6 (v) is applied to a memory cell M to be programmed with data '11', and then followed by verification (S4 and S5). When all the memory cells M have been set at the designated threshold voltages, the programming operation is terminated (S6).

Now, the validity of the programming scheme for a nonvolatile semiconductor memory of the embodiment described heretofore will be confirmed.

Figure 15:
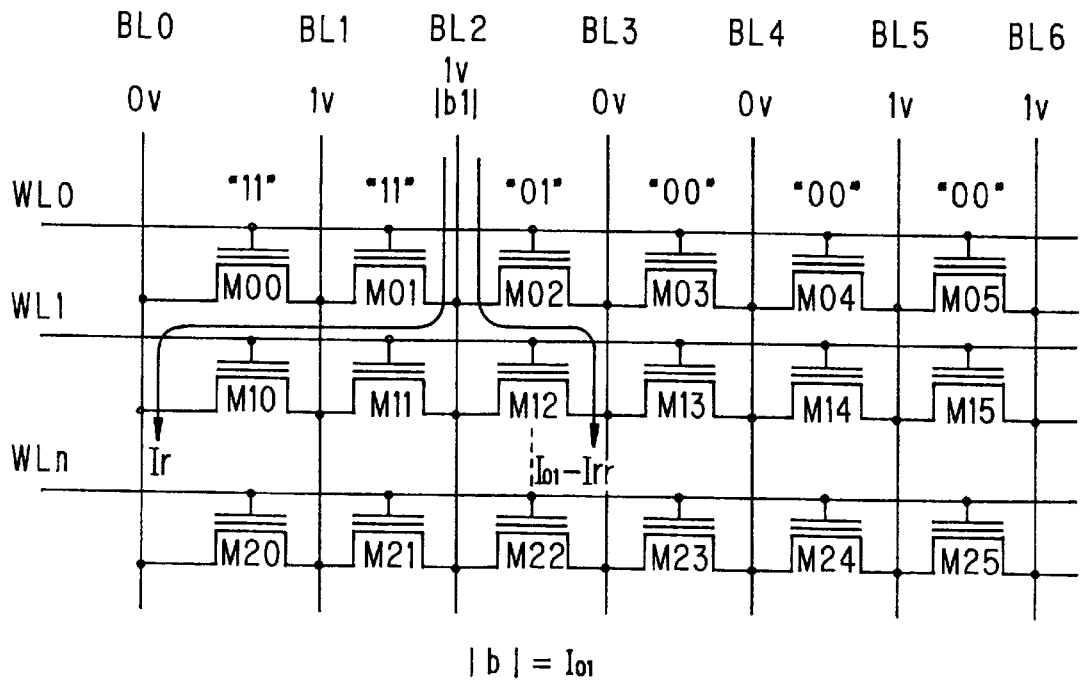
FIG. 15 is an operative illustration showing the current passage for readout of the data from memory cell MO2 when the threshold levels of memory cells MO0 and MO1 are low, in the method of programming the memory cells of the memory in accordance with the first embodiment of the present invention.

To begin with, programming of the pattern of data shown in FIG. 15 will be considered. The pattern of data is that of FIG. 10 for illustration of the conventional example. This pattern corresponds to the case where the apparent threshold level of the remarked memory cell MO2 widens towards the lower side.

First, because of the fluctuations of the characteristics of memory cells M, after the first stage of writing (using dummy reference voltages), memory cell MO2 may be set at a voltage equal to or below the first threshold voltage, i.e., 3.4 (v) while the levels of memory cells MO0 and MO1 may remain at voltages above 3.6 (v) by the first application of pulses. This situation is assumed here.

In this case, after the completion of the application of programming pulses at the first stage, when verification for data '01' is effected with word line WL0 set at 3.4 (v), the threshold voltage is judged to be 3.4 (v) or below.

Figure 9:
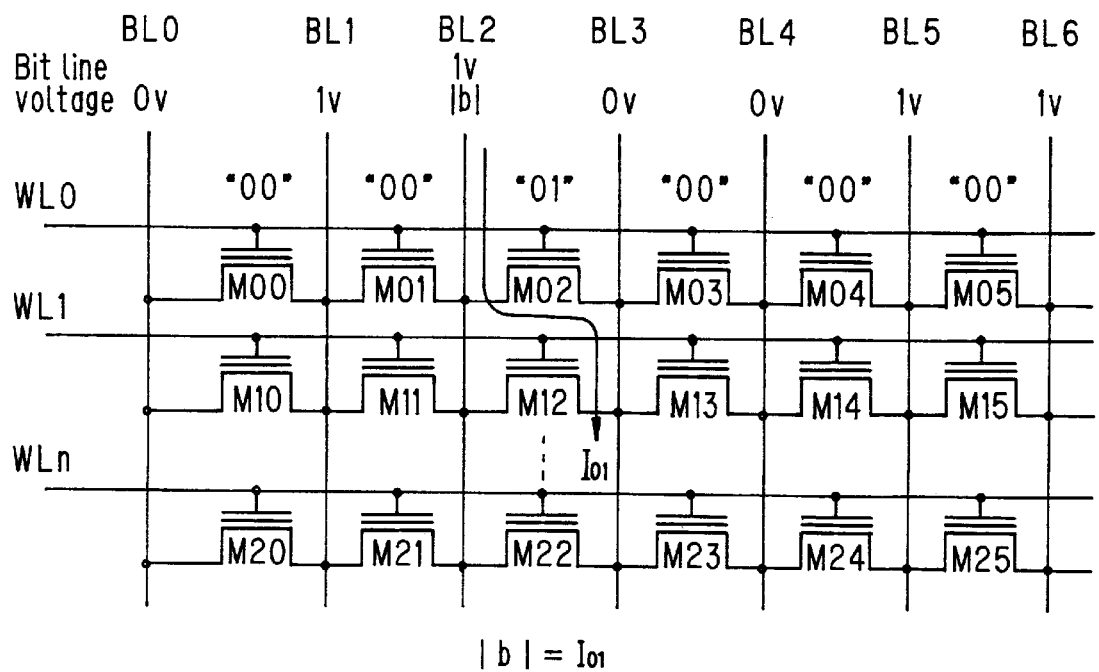
FIG. 9 is an operative illustration showing a normal current passage IO1 when data is read out from a memory cell MO2 of a virtual ground type array in accordance with a conventional programming method.

If data is read out at this moment, the current detected at the node on bit line BL2 is only the normal current IO1 that flows through memory cell MO2 since the pattern of data is almost the same as that shown in FIG. 9.

Next, since the threshold levels of memory cells MO0 and MO1 remain (at 3.6 (v)) higher than the designated first threshold voltage (1.4 (v)), their drain voltages are set at 6 (v) while the drain of memory cell MO2 is set open. Under these conditions, programming pulses are applied again so that programming and verification will be repeated until the threshold level is equal to or below 1.4 (v), the first threshold voltage.

Figure 10:
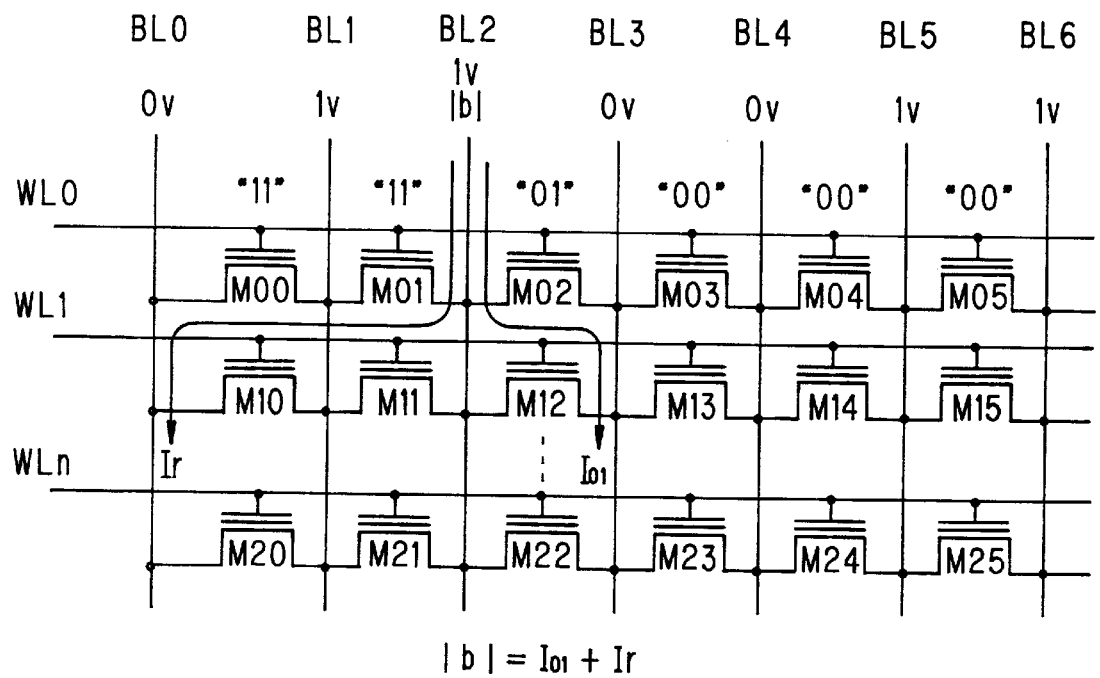
FIG. 10 is an operative illustration showing the generation of a roundabout current Ir when data is read out from a memory cell MO2 of a virtual ground type array in accordance with a conventional programming method.
Figure 11:
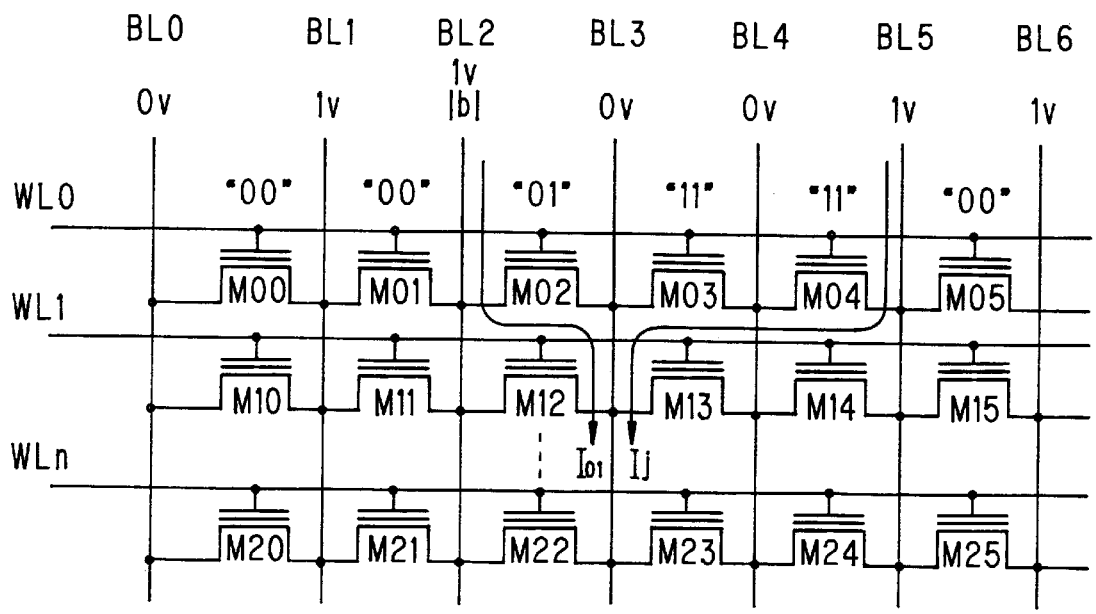
FIG. 11 is an operative illustration showing the generation of a roundabout current Ij when data is read out from a memory cell MO2 of a virtual ground type array in accordance with a conventional programming method.

Suppose that data is read out from memory cell MO2 when the threshold levels of memory cells MO0 and MO1 have reached 1.4 (v) or lower, current $|b|$ including a roundabout current Ir which, as shown in FIG. 10, flows from bit line BL2 to bit line BL0 by way of memory cells MO0 and MO1 will be detected at the node on bit line BL2.

Next, the second stage of writing (corresponding to the period of verification and pulse application based on the normal reference voltages in FIG. 14) is effected. In this case, when the memory cell M to be programmed with data '01' is verified with word line WL0 set at 3 (v), current Ir as stated above flows through memory cells MO0 and MO1 since the threshold voltages of memory cells MO0 and MO1 are equal to 1.4 (v) or lower.

Resultantly, the apparent threshold voltage of memory cell MO2 is lowered and detected at the node on bit line BL2. Therefore, in most cases, memory cell MO2 is determined to have a threshold voltage of 3 (v) or lower. Thus, no additional application of programming pulses to memory cell MO2 will be needed.

The current ($|b1|$) measured at the node on bit line BL2 is represented by the following relationship (1). The notation used in this relationship is summarized below.

$$|b1|=IO1r+Ir \qquad (1)$$

Here, if data is verified with word line WL0 set at 3 (v) as stated above prior to the second stage of writing, the threshold voltage is determined to be at the predetermined level (3 (v) or below). This is because the value of $|b|$ at the time of readout at the node on bit line BL2 when verified with word line WL0 set at 3.4 (v) was determined to substantially coincide with normal current IO1.

At the time of determination, there must exist a roundabout current into memory cells MO0 and MO1, attributed to the potential difference (0.4 (v)) at word line WL0 between 3 (v) and 3.4 (v). Therefore, the normal current IO1 is determined including the roundabout current. Specifically, IO1≅IO1r+Irr. Substituting this into the above relationship (1), $$|b1|=IO1-Irr+Ir \text{ (c.f., FIG. 15).}$$

On the other hand, in the conventional programming scheme, $$|b2|=IO1+Ir(\text{c.f., FIG. 10}).$$

Therefore, in the programming scheme of this embodiment, the influence of the roundabout current is reduced by (−Irr) compared to the conventional programming scheme. This leads to reduction of the widening of the distribution of the threshold voltage.

The above notation is summarized as follows:

$|b1|$: a current detected at the node on BL2 by the programming scheme of this embodiment;

$|b2|$: a current detected at the node on BL2 by the conventional programming scheme;

IO1: a current value of $|b|$ obtained when memory cell MO2 having a threshold voltage of 3 (v) is read out with a readout voltage of 3.4 (v);

IO1r: a current flowing through MO2 when memory cell MO2 having an apparent threshold voltage of 3 (v) is read out with a readout voltage of 3.4 (v);

Ir: a roundabout current flowing through MO0 and MO1 when MO2 is read out with a readout voltage of 3.4 (v); and Irr: the reduced value, on the basis of a readout voltage of 3.4 (v), of the roundabout current which flowed through MO0 and MO1 when MO2 was set into the predetermined threshold voltage based on the present programming scheme.

In conclusion, IO1r is the current expected to contain the final roundabout current flowing through memory cells MO0 and MO1, to some degree (IO1r includes (−Irr) as a component). This situation Is shown in FIG. 15.

From the above discussion, it could be confirmed that the widening of the threshold voltage towards the lower side can be decreased.

Thus, the distribution of the apparent threshold voltage of the memory cell M which has been programmed with data '01' reached 2.2 (v) in the lower direction in the conventional programming scheme, but the lower side boundary can be elevated to about 2.5 (v) according to the programming scheme of the present embodiment.

Figure 16:
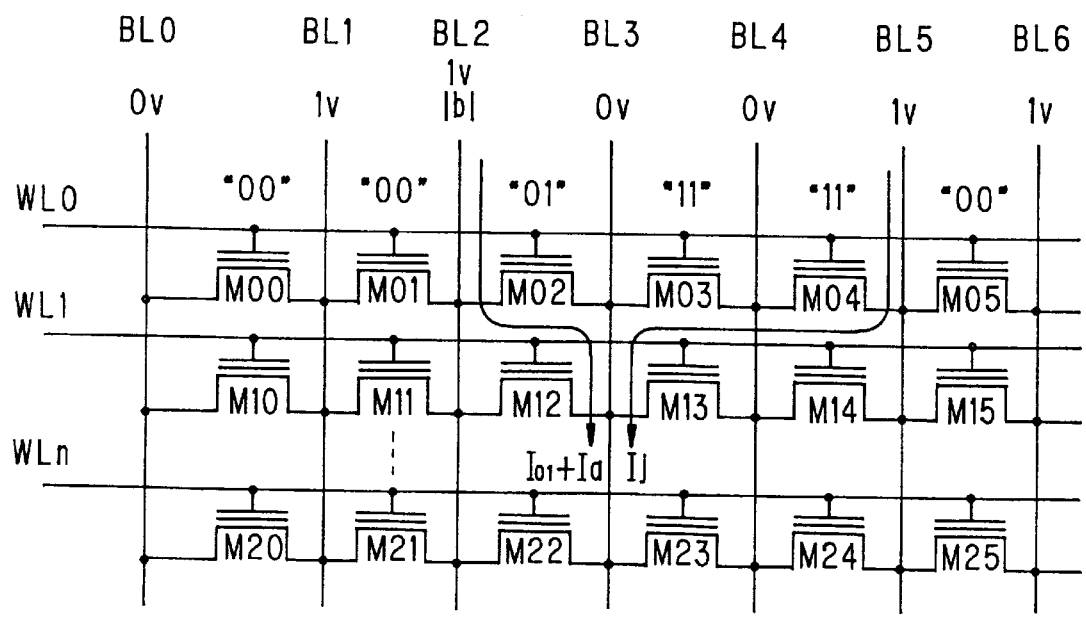
FIG. 16 is an operative illustration showing the current passage for readout of the data from memory cell MO2 when the threshold levels of memory cells MO3 and MO4 are low, in the method of programming the memory cells of the memory in accordance with the first embodiment of the present invention.

Next, a case where the threshold level widens towards the higher side will be discussed with reference to the pattern of data shown in FIG. 16. The pattern of data shown in FIG. 16 is that of FIG. 11 used for illustration of the conventional example. This pattern corresponds to the case where the apparent threshold level of the remarked memory cell MO2 widens toward the higher side.

Because of the fluctuations of the characteristics of memory cells M, after the first stage of writing, memory cell MO2 may be set at a voltage equal to or below the first threshold voltage, i.e., 3.4 (v) while the level of memory cells MO3 and MO4 may be little varied remaining at voltages above 3.6 (v) by the first application of pulses. This situation is assumed here.

If data is read out from memory cell MO2 at this moment, the current detected at the node on bit line BL2 is only the normal current IO1 that flows through memory cell MO2 since the pattern of data is almost the same as that shown in FIG. 9.

Since programming of memory cell MO2 has been completed, writing and verification of memory cells MO3 and MO4 are repeated. This writing is terminated when memory cells MO3 and MO4 come to have the first threshold voltage, i.e., 1.4 (v) or below.

After the completion of the first stage of writing, if the data is read out, the potential on the bit line BL3 rises due to current Ij that flows from bit line BL5 by way of memory cells MO3 and MO4 so that the current detected at the node on bit line BL2 will be reduced ($|b|=IO1-Ia$) as stated above. Due to this reduction in the detected current, the apparent threshold voltage of memory cell MO2 becomes higher and is assumed to be about 3.6 (v).

Next, the second stage of writing is effected. In this case, when the memory cell M to be programmed with data '01' is verified with word line WL0 set at the second threshold voltage 3 (v), the threshold voltage of memory cell MO2 is detected to be greater than 3 (v). Therefore, application of programming pulses of Vd=4 (v) to bit line BL2 and its verification are repeated until the threshold voltage becomes equal to 3 (v) or below.

When this memory cell MO2 is verified, the threshold voltages of memory cells MO3 and MO4 have already reached 1.4 (v) or lower. This means that the threshold voltage of memory cell MO2 is determined including (taking into account) this roundabout current Ij. Therefore, the apparent threshold voltage of memory cell MO2 is set at about 3 (v).

This means that the current |b| at the time of readout at the node on bit line BL2 substantially coincides with the normal current IO1. Therefore, |b| can be written as follows:

$$|b| \approx IO1 = (IO1 + Ia) - Ia \qquad (2)$$

(Here, Ia: the amount of the reduction of the current flowing through memory cell MO2 as a result of the raised potential at bit line BL3 above 0 (v) due to the roundabout current Ij into bit line BL3)

In the relationship (2), the parentheses indicate that the threshold voltage is determined by (IO1+Ia) which includes the roundabout current.

This situation is schematically shown in FIG. 16.

Thus, the shift of the threshold voltage towards the higher side caused by the virtual ground array configuration can be reduced.

Actually, since the threshold voltages of memory cells MO3 and MO4 lower from 1.4 (v) to 1 (v) by the second stage of writing, the threshold voltage in question will shift slightly to the higher side but the total shift can be decreased. That is, the upper boundary of the distribution is limited by about 3.1 (v) though it reached 3.2 (v) towards the higher side in the conventional scheme.

As described heretofore, the distribution of the apparent threshold level of the memory cell M that has been programmed with data '01' has a range of 1 (v) spreading from 2.2 to 3.2 (v) in the conventional scheme. In contrast, in the scheme of the present embodiment, it can be suppressed to 0.6 (v) ranging from 2.5 to 3.1 (v).

The Second Embodiment

In the above first embodiment, since the three levels of data ('11', '10' and '01') need to be verified, programming with a large number of verification operations may take a long time.

Figure 17:
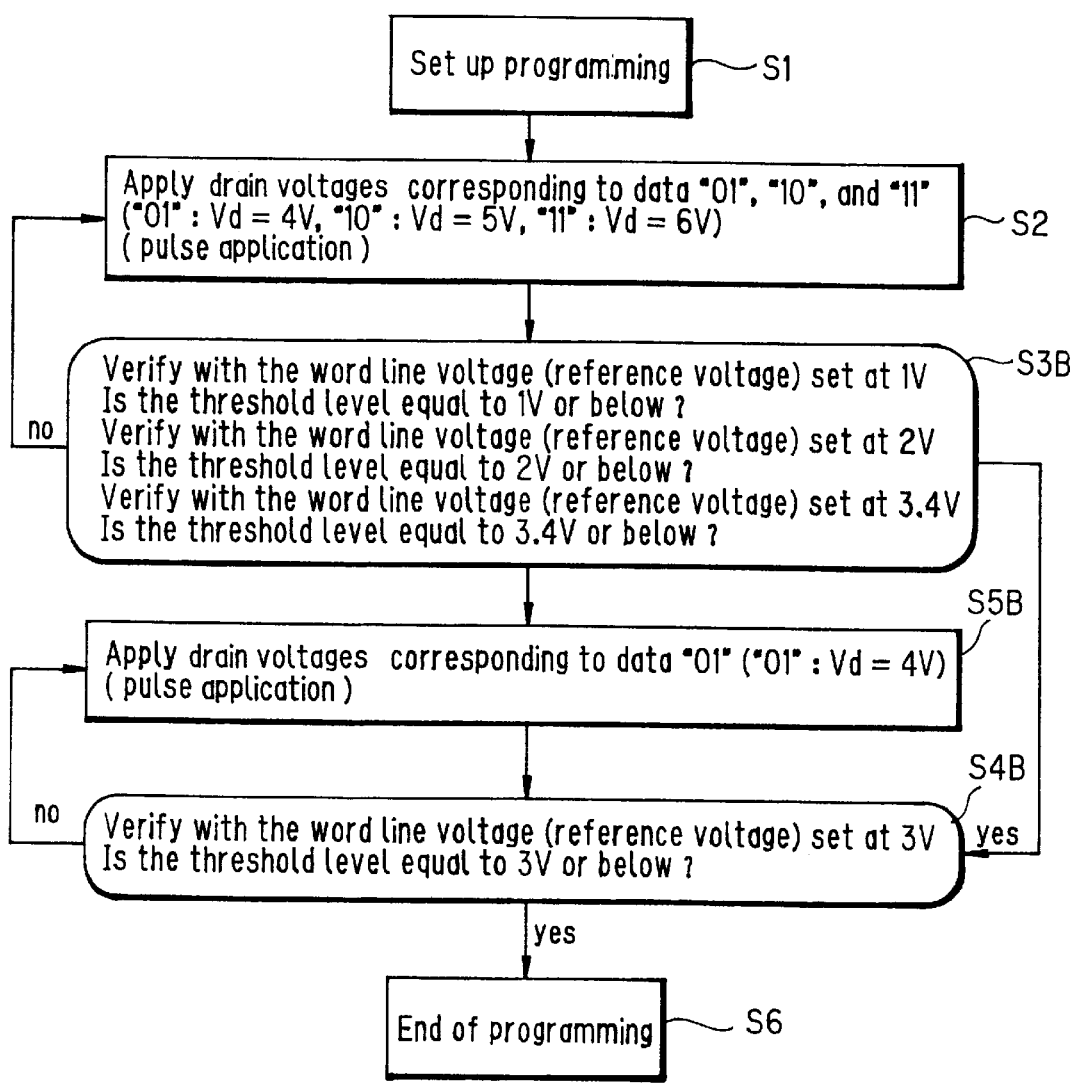
FIG. 17 is a flowchart for illustrating a method of writing multilevel data to the memory cells of the memory in accordance with the second embodiment of the present invention.

To deal with this situation, the algorithm of the programming method for a nonvolatile semiconductor storage in accordance with the second embodiment is described with reference to the flowchart shown in FIG. 17. Here, the same components as above are allotted with the same reference numerals and the description will be omitted.

Figure 18:
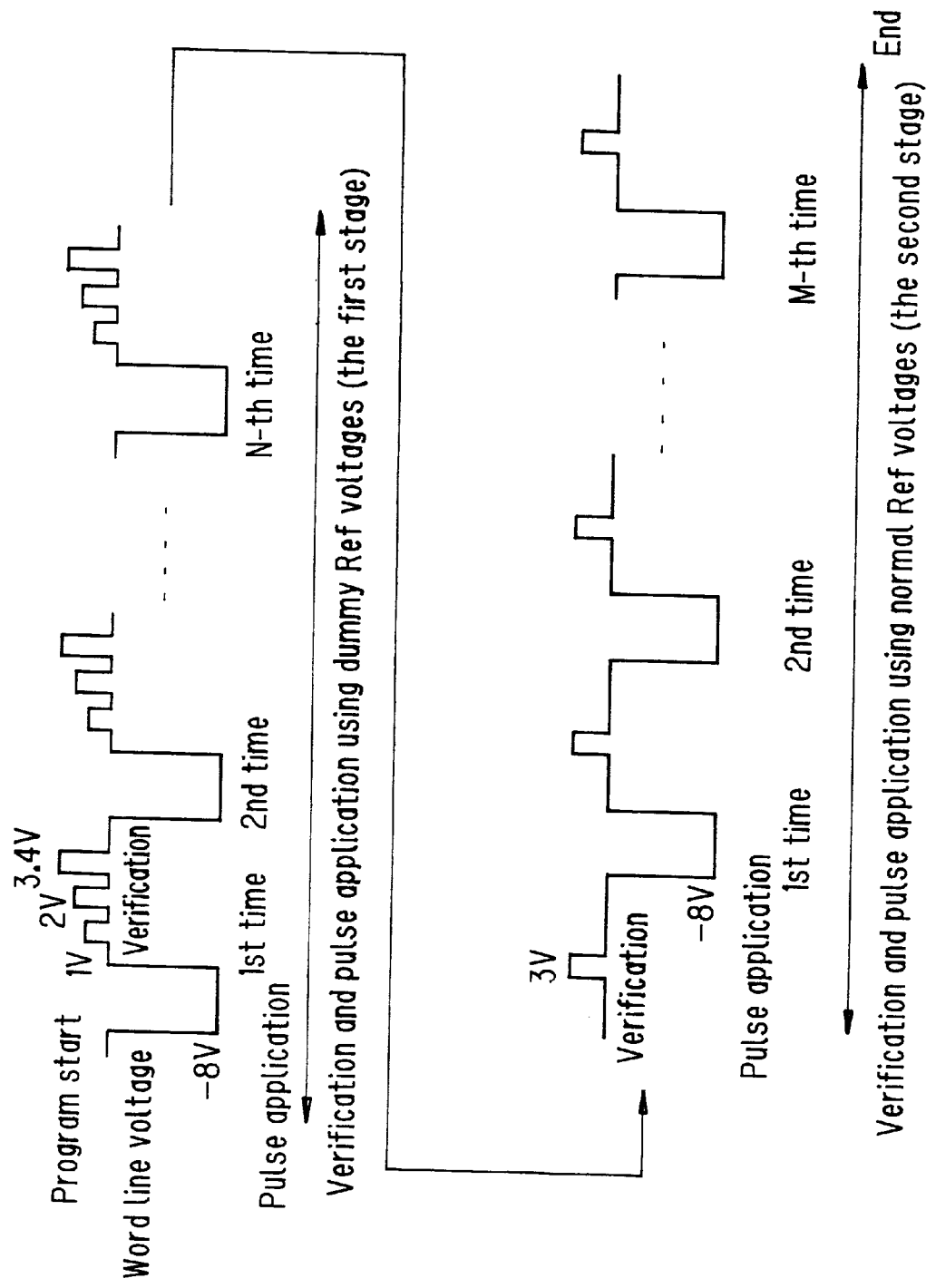
FIG. 18 is an operative diagram for illustrating the pulse application and verification sequence of the method of writing multilevel data to the memory cells of the memory in accordance with the second embodiment of the present invention.

Also the sequence of programming voltage application and its verification is shown in FIG. 18.

This embodiment is to make an improvement for reducing the widening of the distribution of the threshold voltage of a memory cell M which has been programmed with data '01' since data '01' is most affected by widening of threshold voltage.

As the programming operation is started (S1), the associated word line for programming is set at −8(v) and then drain voltages Vd are set in accordance with the corresponding data (S2). The applied voltages and sequence of the voltage application for programming are same as in the above first embodiment, so the description will not be repeated.

Then the verify operation follows the programming operation. Memory cells to be programmed with data '11' and '10' are verified with verifying voltages of 1 (v) and 2 (v), respectively so as to obtain the finally designated threshold voltages (the second threshold voltages) (S3B).

On the other hand, memory cells to be programmed with data '10' are verified with a verifying voltage of 3.4 (v) (S3B) in order to set these cells at the first threshold voltage, similarly to the first embodiment described above.

After the completion of the first stage of writing and hence after the threshold voltages of all the memory cells M have reached equal to or below the predetermined levels, as the second stage, the memory cells M to be programmed with data '01' are verified with 3 (v) applied to the associated word line (S4B).

This is to determine whether the threshold voltage of memory cell M to be programmed with data '01' is not higher than 3 (v) or falls within the range of 3 to 3.4 (v).

Thereafter, if the threshold level of the memory cells M to be programmed with '01' are equal to or lower than 3 (v), the programming operation is ended (S6).

On the other hand, if the threshold level is above 3 (v) (3 to 3.4 (v)), a drain voltage Vd of 4 (v) is applied to the associated memory cells M while the drains of other memory cells M are set open(S5B). Thus the writing and verification are repeated (S4B). When all the threshold voltages of the memory cells M to be programmed with '01' have been set at 3 (v) or lower, the programming operation is completed (S6).

Now, the validity of the programming scheme will be confirmed.

To begin with, programming of the pattern of data shown in FIG. 15 will be considered. The pattern of data is that of FIG. 10 for illustration of the conventional example. This pattern corresponds to the case where the apparent threshold level of the remarked memory cell MO2 widens towards the lower side.

Because of the fluctuations of the characteristics of memory cells M, after the first stage of writing, memory cell MO2 may be set at a voltage equal to or below 3.4 (v) while the levels of memory cells MO0 and MO1 may remain at voltages above 3.6 (v) by the first application of pulses. In this case, after the completion of the application of programming pulses, when verification for data '01' is effected with word line WL0 set at 3.4 (v), the threshold voltage is judged to be 3.4 (v) or below.

If data is read out at this moment, the current detected at the node on bit line BL2 is only the normal current IO1 that flows through memory cell MO2 since the pattern of data is almost the same as that shown in FIG. 9.

Next, since the threshold levels of memory cells MO0 and MO1 remain higher than the designated threshold voltage, the voltages (Vd) at their drains are set at 6 (v) while the drain of memory cell MO2 is set open. Under these conditions, programming pulses are applied again so that writing and verification will be repeated until the threshold level is equal to or below 1 (v), the finally designated threshold voltage.

Suppose that data is read out from memory cell MO2 when the threshold level has reached 1 (v) or lower, a current including a roundabout current which, as shown in FIG. 15, flows from bit line BL2 to bit line BL0 by way of memory cells MO0 and MO1 will be detected at the node on bit line BL2.

Next, the second stage of writing and verification is effected. In this case, when the memory cell M to be programmed with data '01' is verified with word line WL0 set at 3 (v), a roundabout current flows through memory cells MO0 and MO1 since the threshold voltages of memory cells MO0 and MO1 are have already reached 1 (v) or lower.

Resultantly, the apparent threshold voltage of memory cell MO2 is lowered and detected at the node on bit line BL2. Therefore, in most cases, memory cell MO2 is determined to have a threshold voltage of 3 (v) or lower. Thus, no additional application of programming pulses to memory cell MO2 will be needed.

The readout current (|b1|) at the node on bit line BL2 is represented as follows. The notation used in this relationship is summarized below.

$$|b1|=IO1r+Ir \quad (3)$$

Here, if data is verified with word line WL0 set at 3 (v) as stated above prior to the second stage of writing, the threshold voltage is determined to be at the predetermined level (3 (v) or below). This is because the value of readout current |b1| at the time of readout at the node on bit line BL2 when verified with word line WL0 set at 3.4 (v) was determined to substantially coincide with normal current IO1.

At the time of determination (word line WL0=3 (v)), there must exist a roundabout current Irr into memory cells MO0 and MO1 corresponding to that with word line WL0 set at 3.4 (v). Therefore, the normal current IO1 is determined including this roundabout current Irr.

Specifically, $IO1 \cong IO1r+Irr$. Substituting this into the above relationship (3), $$|b1|=IO1-Irr+Ir(\text{c.f., FIG. 15}).$$

On the other hand, in the conventional programming scheme, $$|b2|=IO1+Ir(\text{c.f., FIG. 10}).$$

Therefore, in the programming scheme of this embodiment, the influence of the roundabout current is reduced by (−Irr) compared to the conventional programming scheme. This leads to reduction of the widening of the distribution of the threshold voltage.

The above notation is summarized as follows:

|b1|: a current detected at the node on BL2 by the programming scheme of this embodiment;

|b2|: a current detected at the node on BL2 by the conventional programming scheme;

IO1: a current value of readout current |b1| obtained when memory cell MO2 having a threshold voltage of 3 (v) is read out with a readout voltage of 3.4 (v);

IO1r: a current flowing through MO2 when memory cell MO2 having an apparent threshold voltage of 3 (v) is read out with a readout voltage of 3.4 (v);

Ir: a roundabout current flowing through MO0 and MO1 when MO2 is read out with a readout voltage of 3.4 (v); and Irr: the reduced value, on the basis of a readout voltage of 3.4 (v), of the roundabout current which flowed through MO0 and MO1 when MO2 was set into the predetermined threshold voltage based on the present programming scheme.

In conclusion, IO1r is the current expected to contain the final roundabout current flowing through memory cells MO0 and MO1, to some degree (IO1r includes −Irr as a component).

This situation is shown in FIG. 15. In this way, the widening of the distribution of the threshold voltage towards the lower side can be decreased.

Thus, the distribution of the apparent threshold voltage of the memory cell M which has been programmed with data '01' reached 2.2 (v) toward the lower side in the conventional programming scheme, but the lower side boundary can be elevated to about 2.55 (v) according to the programming scheme of the present embodiment.

Compared to the first embodiment, the widening of the threshold voltage as to data '01' is improved. This is because the threshold voltages of the memory cells programmed with data '11' were not greater than 1 (v) when the first stage of writing was completed. That is, in the first embodiment, the threshold voltages of the memory cells M programmed with data '11' are reduced from 1.4 (v) to 1 (v) by the second stage after the threshold voltage of the memory cell M to be programmed with data '01' has been confirmed, the roundabout current slightly increases and hence the apparent threshold voltage further lowers. But the second embodiment is free from the reduction in the threshold level due to this effect.

Next, a case where the threshold level widens towards the higher side will be discussed with reference to the pattern of data shown in FIG. 16.

This pattern of data is the same pattern as illustrated with reference to FIG. 11 for the conventional example. This pattern corresponds to the case where the apparent threshold voltage of the remarked memory cell MO2 widens towards the higher side.

Because of the fluctuations of the characteristics of memory cells M, after the first stage of writing, memory cell MO2 may be set at a voltage equal to or below 3.4 (v) while the level of memory cells MO3 and MO4 may little change and remain at voltages above 3.6 (v) by the first application of pulses. This situation is assumed here.

If data is read out from memory cell MO2 at this moment, the current detected at the node on bit line BL2 is only the current that flows through memory cell MO2 since the pattern of data is almost the same as that shown in FIG. 9.

Since programming of memory cell MO2 has been completed, writing and verification of memory cells MO3 and MO4 are repeated. This writing is terminated when memory cells MO3 and MO4 come to have threshold voltages of 1 (v) or below.

After the completion of this writing, if the data is read out, the potential on the bit line BL3 rises due to a current that flows from bit line BL5 (1 (v)) by way of memory cells MO3 and MO4 so that the current detected at the node on bit line BL2 will be reduced as stated above.

Due to this reduction in the detected current, the apparent threshold voltage of memory cell MO2 becomes higher and is assumed to be about 3.6 (v).

Next, the second stage of writing and verification is effected. First, when the memory cell M to be programmed with data '01' is verified with word line WL0 set at 3 (v), the threshold voltage of memory cell MO2 is detected to be greater than 3 (v). Therefore, application of programming pulses of drain voltage Vd of 4 (v) to bit line BL2 and its verification are repeated until the threshold voltage become equal to 3 (v).

When this memory cell MO2 is verified, the threshold voltages of memory cells MO3 and MO4 have already reached 1 (v) or lower. This means that the threshold voltage of memory cell MO2 is determined including (taking into account) this roundabout current. Therefore, the apparent threshold voltage of memory cell MO2 is set at about 3 (v).

This means that the current |b| at the time of readout at the node on bit line BL2 substantially coincides with IO1. Therefore, |b| can be written as follows:

$$|b| \approx IO1 = (IO1+Ia)-Ia \quad (4)$$

(Here, Ia: the amount of the reduction of the current flowing through memory cell MO2 as a result of the raised potential at bit line BL3 above 0 (v) due to the roundabout current Ij into bit line BL3)

In the relationship (4), the term in parentheses indicates that the threshold voltage Is determined by (IO1+Ia) which includes the roundabout current Ij. This situation is schematically shown in FIG. 16.

Thus, the shift of the threshold voltage towards the higher side caused by the virtual ground array configuration can be reduced. As a result, the upper boundary of the distribution of the threshold voltage of memory cell N programmed with data '01' can be limited by about 3.05 (v), though It reached 3.2 (v) in the conventional scheme.

As described heretofore, the distribution of the apparent threshold level of the memory cell M that has been programmed with data '01' has a range of 1 (v) spreading from 2.2 to 3.2 (v). In contrast, in the scheme of the present embodiment, it can be suppressed to 0.5 (v) ranging from 2.55 to 3.05 (v).

In the first embodiment, since the threshold voltages of memory cells MO3 and MO4 change from 1.4 (v) to 1 (v) by the second stage of writing, the apparent threshold voltage of memory cell MO2 (data '01') shifts to 3.1 (v) at this second stage. This embodiment of the programming method is improved in this respect.

In the programming method of the second embodiment, only the data having the most wide distribution of the apparent threshold voltage, i.e., data '01' is improved while the data having less wide distribution of the threshold voltage (or less affected), i.e., data '11' and '10' are left as they are so as to shorten the total time for programming (including verification).

First, the verifying operation prior to the second stage of writing eliminates unnecessary programming of memory cells M, thus making it possible to prevent the distribution of the threshold voltage from being further widened.

In the present embodiment, it is also possible to set data '10' at the first threshold level at the first stage of writing. That is, this may be done by taking into account the spread of the distribution of the threshold voltage and the time taken for programming, in such an order as giving priority to the data which is affected more greatly by the spread of the threshold voltage.

In the description of the embodiments, preferred configurations of the invention have been described, but the present invention should not be limited to these.

For example, the present invention can be applied to those which are of a virtual ground array type, without being limited to the four-level configuration or ACT type flash memory, though an example of an four-level ACT type flash memory was described.

The order of verification of each value described using FIGS. 14 and 18 will not particularly be limited thereto.

Further, for readout (of which the detailed description is omitted since a well-known method is used), the readout voltage for each value can be set at the same voltage as the verifying voltage to which the memory cell is set the first threshold voltage during writing.

For example, readout voltages D1, D2 and D3 shown in FIG. 7 may be set equal to 1.4 (v), 2.4 (v) and 3.4 (v), respectively which are the verifying voltages for programming, and applied to the associated word line.

This configuration only needs three levels of set voltages and hence can reduce the number of voltage source circuits compared to the configuration where readout and verifying voltages are set individually. Therefore, this enables simplification of the circuit configuration.

As has been described heretofore, in accordance with the present invention, it is possible to reduce the widening of the distribution of the threshold levels occurring due to programming (programming with verification) and during readout, which results from virtual ground type array configurations of non-volatile semiconductor storage device such as an ACT type flash memory. Therefore, the present invention can provide a wide margin, thus making it possible to realize a highly reliable multilevel flash memory.

The reduction of the widening of the distribution of the threshold level also contributes to low-voltage driving of a flash memory.

Further, it is also possible to provide a wide reading margin for practical use while reducing the time for multi-level programming.

Moreover, the reduction of the widening of the threshold according to the programming method of the present invention also contributes to a relaxing of the conditions for manufacturing flash memory devices and the test conditions thereof, which improves the production yield and hence results in reduction of the device cost.

What is claimed is:

1. A data programming method for a nonvolatile semiconductor storage device comprising:
    a number of field effect transistors each having a control gate, a drain and a source with an electrically data-programmable and erasable floating gate, arranged matrix-wise in rows and columns forming an array;
    a plurality of row lines, each being connected to the control gates of the field effect transistors in one row; and
    a plurality of column lines, each being connected to the drains of the field effect transistors in one column and also connected to the sources of the field effect transistors in the adjacent column so that each is shared by the two adjacent columns, forming a virtual ground type array, wherein three or more classes of data can be electrically written into each field effect transistor by differentiating the threshold level of the charge amount accumulated on the floating gate, the method comprising:
    the first writing step for setting the charge amount on the floating gate of each field effect transistor to be programmed with target data by a first programming voltage at a first threshold level other than the threshold level of target data by setting a reference voltage for verification to a first reference voltage; and
    the second writing step for setting the charge amount on the floating gate of the field effect transistor by the first programming voltage at the threshold level of target data by setting the reference voltage for verification to a second reference voltage, after the first writing step.

2. The data programming method for a nonvolatile semiconductor storage device according to claim 1, wherein the three or more classes of data are, based on the threshold levels of the data, composed of a first group of data which is written in by skipping the first writing step and effecting the second writing step and a second group of data which is written in by effecting both the first and second writing steps.

3. The data programming method for a nonvolatile semiconductor storage device according to claim 1 or 2, wherein the first threshold level is set at a level higher than the threshold level of the target data.

4. The data programming method for a nonvolatile semiconductor storage device according to claim 2, wherein the second group of data which is written in by both the first and second writing steps includes the data having the second to highest threshold level among the three or more classes of data.

5. The data programming method for a nonvolatile semiconductor storage device according to claim 2, wherein the first group of data which is written in by skipping the first step includes the data having the lowest threshold level among the three or more classes of data.

6. The data programming method for a nonvolatile semiconductor storage device according to claim 1, further comprising a step of verifying the threshold level of target data, prior to the second writing step.

7. The data programming method for a nonvolatile semiconductor storage device according to claim 1, wherein a verifying voltage to be used for verifying the first threshold level in the first writing step is equal to a readout voltage to be used for reading out the data having been written in the field effect transistors.

8. A data programming method for a nonvolatile semiconductor storage device comprising:

a number of field effect transistors each having a control gate, a drain and a source with an electrically data-programmable and erasable floating gate, arranged matrix-wise in rows and columns forming an array;

a plurality of row lines, each being connected to the control gates of the field effect transistors in one row; and a plurality of column lines, each being connected to the drains of the field effect transistors in one column and also connected to the sources of the field effect transistors in the adjacent column so that each is shared by the two adjacent columns, forming a virtual ground type array, wherein three or more classes of data can be electrically written into each field effect transistor by differentiating the threshold level of the charge amount accumulated on the floating gate, the method comprising:

the first writing step for setting the charge amount on the floating gate of each field effect transistor to be programmed with target data at a first threshold level other than the threshold level of target data; and the second writing step for setting the charge amount on the floating gate of the field effect transistor at the threshold level of target data, after the first writing step;

wherein the three or more classes of data are, based on the threshold levels of the data, composed of a first group of data which is written in by skipping the first writing step and effecting the second writing step and a second group of data which is written in by effecting both the first and second writing steps.

9. The data programming method for a nonvolatile semiconductor storage device according to claim 8, wherein the first threshold level is set at a level higher than the threshold level of the target data.

10. The data programming method for a nonvolatile semiconductor storage device according to claim 8, wherein the second group of data which is written in by both the first and second writing steps includes the data having the second to highest threshold level among the three or more classes of data.

11. The data programming method for a nonvolatile semiconductor storage device according to claim 8, wherein the first group of data which is written in by skipping the first step includes the data having the lowest threshold level among the three or more classes of data.

12. The data programming method for a nonvolatile semiconductor storage device according to claim 8, further comprising a step of verifying the threshold level of target data, prior to the second writing step, when the second group data is written.

13. The data programming method for a nonvolatile semiconductor storage device according to claim 8, wherein a verifying voltage to be used for verifying the first threshold level in the first writing step of the second group of data is equal to a readout voltage to be used for reading out the data having been written in the field effect transistors.

* * * * *